(12) United States Patent
Furukawa et al.

(10) Patent No.: US 7,271,878 B2
(45) Date of Patent: Sep. 18, 2007

(54) WAFER CELL FOR IMMERSION LITHOGRAPHY

(75) Inventors: Toshiharu Furukawa, Essex Junction, VT (US); Mark Charles Hakey, Fairfax, VT (US); David Vaclav Horal, Essex Junction, VT (US); Charles William Koburger, III, Delmar, NY (US); Peter H. Mitchell, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 560 days.

(21) Appl. No.: 10/829,623

(22) Filed: Apr. 22, 2004

(65) Prior Publication Data

US 2005/0237501 A1 Oct. 27, 2005

(51) Int. Cl.
*G03B 27/52* (2006.01)
*G03B 27/58* (2006.01)
(52) U.S. Cl. .......................... 355/72; 355/30
(58) Field of Classification Search ............... 355/30, 355/53, 72, 77
See application file for complete search history.

(56) References Cited

U.S. PATENT DOCUMENTS 6,954,256 B2 * 10/2005 Flagello et al. ............... 355/53
7,009,682 B2 * 3/2006 Bleeker ....................... 355/53

FOREIGN PATENT DOCUMENTS

DE 221563 A1 * 4/1985
DE 224448 A1 * 7/1985

* cited by examiner

*Primary Examiner*—Rodney Fuller
(74) *Attorney, Agent, or Firm*—Rabin & Berdo, PC

(57) ABSTRACT

An apparatus, system and method for use with a photolithographic system. In accordance with one embodiment, the photolithographic system of the present invention includes a workpiece support member for supporting a semiconductor wafer. A substantially transparent cover member is disposed over the workpiece support member to form a substantially enclosed workpiece cell therebetween. The enclosed workpiece cell is filled with a first immersion fluid having suitable refractive properties. The cover member, having suitable refractive properties, includes an upper surface contoured to form an open reservoir containing a second immersion fluid, having suitable refractive properties, and in which a final lens element may be immersed during a lithography process.

15 Claims, 4 Drawing Sheets

WAFER CELL FOR IMMERSION LITHOGRAPHY

BACKGROUND OF THE INVENTION

1. Field of the Invention

The present invention generally relates to lithography for semiconductor fabrication, and in particular, to utilizing a liquid medium through which a semiconductor substrate is illuminated during optical lithography. More particularly, the present invention relates to an immersion lithography method and apparatus that employs a contained wafer immersion cell to increase the numerical aperture while minimizing sources of photolithographic light obstruction.

2. Background Information

Lithography, in the context of building integrated circuits (ICs) such as microprocessors and memory chips, is a highly specialized printing process used to put detailed patterns onto silicon wafers. An image containing the desired pattern is projected onto the wafer through a mask defining the pattern. Prior to light projection through the mask, the wafer is coated with a thin layer of photosensitive etch resistant material called "photoresist" or "resist". For a positive acting resist, for example, the bright parts of the image pattern cause chemical reactions which cause the resist material to become more soluble, and thus dissolve away in a developer liquid, wherein the dark portions of the image remain insoluble. After development, the resist forms a stenciled pattern across the wafer surface which accurately matches the desired mask pattern. Finally, the pattern is permanently transferred onto the wafer surface in an etching process wherein, for example, a chemical etchant is used to etch the portions of the wafer surface not protected by resist; or the pattern may be transferred by ion implantation in which the resist pattern prevents ions from reaching portions of the wafer surface.

With the image resolution of lithography as a limiting factor in the scaling of IC devices, improvements in lithographic components and techniques are critical to the continued development of more advanced and compact ICs. The optical lithography scaling limitation for feature width is expressed by the Rayleigh equation:

$$W = \frac{k\lambda}{NA}$$

where k is the resolution factor, λ is the wavelength of the exposing radiation, and NA is the numerical aperture. NA may be determined by the acceptance angle of the lens and the index of refraction of the medium surrounding the lens, as follows:

NA=n sin α where n is the index of refraction of the medium between the lens and the image plane and α is the acceptance angle of the lens.

Faced with problems and limitations relating to using shorter wavelength light sources, optical lithography developers have increasingly looked for ways of increasing the NA of lithography systems. Having low radiation absorption characteristics and for ease of implementation, air has traditionally been used as the transmitting medium. However, having an index of refraction n=1, air as the transmitting medium presents a clear limit to the NA and consequently to the minimum scaling size. Immersion lithography, in which a liquid having a higher index of refraction is used as the medium, is therefore rapidly emerging as an important candidate for upcoming semiconductor lithography applications.

Several immersion lithography techniques are known in the art. One approach, sometimes referred to as the "swimming pool" method, involves wholly or partially submerging the wafer stage, wafer and lens in a pool of immersion fluid, typically water. This technique is referred to as the "bathtub" method when the pool is circulating. Another approach, commonly referred to as the "shower" method, employs nozzles to inject water between the lens and the wafer wherein a suction port for liquid recovery uptakes the injected liquid on the opposite side of the lens after it passes under the lens.

While the foregoing techniques represent progress in the development of this new technology, a number of practical implementation issues remain, including maintaining a pure, non-obstructing transmission medium and compatibility of the tools and wafer with the liquid medium. Purified and degassed water, having a light absorption of 5% at working distances up to 6 mm and an index of refraction n=1.47, may be a suitable medium for immersion lithography. However, problems remain relating to the tendency to form bubbles during the scanning processing. The stage on a lithography exposure tool steps from location to location across a wafer scanning the reticle image for each field. To achieve high throughput, the stage must accelerate rapidly through the immersion fluid, move accurately to the next field location, settle, scan the image and then step to the next location all in a short period of time.

A water medium is susceptible to forming micro bubbles and nano bubbles in the cavitation prone water layer near the moving surfaces, resulting in imaging obstruction and anomalies. Anomalous effects can include absorption, scatter, or an induced birefringent effect with the directional flow of the fluid. Microbubble formation is particularly acute on or adjacent the cavities present in the relatively rough topography at the resist/wafer surface. In addition to problems associated with maintaining purity of the liquid, prior art immersion lithography techniques require substantial redesign of stages for compatibility in a submerged liquid environment requiring significant re-engineering and adding to development costs. Included among the many issues posed by conventional immersion lithography are modifications to lens design and lens casing for compatibility with the resist and immersion liquid, and maintaining immersion liquid properties such as purity, temperature, etc.

From the foregoing, it can be appreciated that a need exists for an improved immersion lithography system and method that substantially increases the NA while minimizing obstruction and distortion of the scanned image. The present invention addresses such a need.

SUMMARY OF THE INVENTION

An apparatus, system and method for use with a photolithographic system are disclosed herein. In accordance with one embodiment, the photolithographic system of the present invention includes a workpiece support member for supporting a semiconductor wafer. A substantially transparent cover member is disposed over said workpiece support member to form a substantially enclosed workpiece cell therebetween. The enclosed workpiece cell is filled with a first immersion fluid having suitable refractive properties. The cover member includes an upper surface contoured to form an open reservoir containing a second immersion fluid in which a final lens element may be immersed during a lithography process.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DETAILED DESCRIPTION OF A PREFERRED EMBODIMENT

The invention will now be described in more detail by way of example with reference to the embodiments shown in the accompanying figures. It should be kept in mind that the following described embodiments are only presented by way of example and should not be construed as limiting the inventive concept to any particular physical configuration.

Further, if used and unless otherwise stated, the terms "upper," "lower," "front," "back," "over," "under," and similar such terms are not to be construed as limiting the invention to a particular orientation. Instead, these terms are used only on a relative basis.

The present invention is directed toward an improved optical or photolithographic apparatus, system and method in which one or more immersion fluids are utilized to increase the index of refraction and consequently increase the numerical aperture. In one embodiment, the invention employs a layered liquid immersion technique that enables a semiconductor workpiece to be immersed in the controlled environment of a substantially enclosed cell while a final lens cover element is disposed within a second immersion fluid contained in an open reservoir positioned over the enclosed cell. As depicted and explained in further detail with reference to the figures, the open reservoir is preferably defined by the upper surface contour of a transparent cell cover that forms the barrier between the enclosed cell and open reservoir. In this manner, the numerical aperture of a photolithographic light beam passing down from the lens cover, through a first immersion fluid layer, the cell cover and the second immersion fluid layer, and onto the surface of the semiconductor workpiece is determined by the respective indices of refraction of the fluid and cell cover layers. The divided immersion layering technique of the present invention enables the use of at least two different immersion fluids, one having chemical properties more compatible with the semiconductor workpiece and the other more compatible with the final lens element immersed in the open reservoir. The immersion fluid separation further enables independent monitoring and control of flow, pressure, and temperature of the respective fluid layers.

While the depicted embodiment shows a system that bounds the reservoir by the cell cover, the workpiece and the workpiece support, it should be understood that the present invention applies to other reservoir containment, such as a reservoir bounded by the cell cover and workpiece alone.

Figure 1:
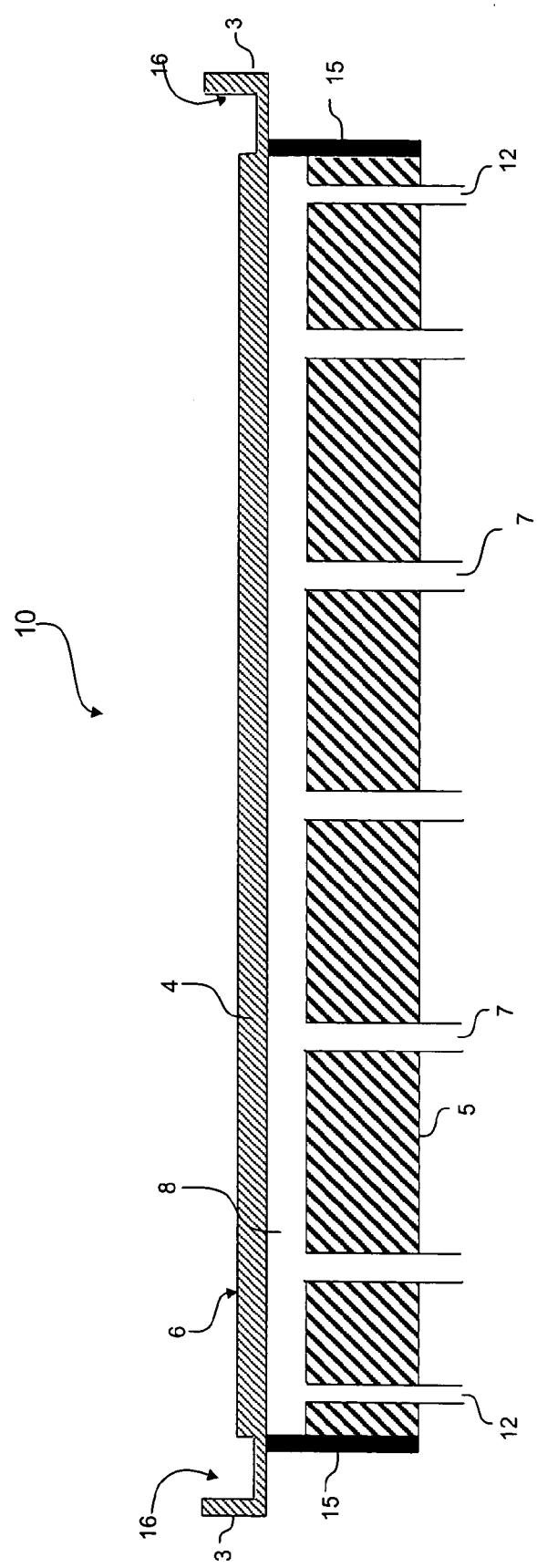
FIG. 1 depicts a cross section of a photolithographic apparatus in accordance with a preferred embodiment of the present invention.

With reference now to the figures, wherein like reference numerals refer to like and corresponding parts throughout, and in particular with reference to FIG. 1, there is depicted a cross section of a photolithographic apparatus 10 in accordance with a preferred embodiment of the present invention. Photolithographic apparatus 10 generally comprises a cell cover member 4 supported by support members 15 and disposed over a workpiece support member 5 to form a substantially enclosed workpiece cell 8 into which a workpiece (not depicted), such as a semiconductor wafer, may be suitably positioned. For a typical lithography exposure process, it may be desirable to adjust the wafer top surface height as determined by the position of workpiece support member 5 to establish and maintain focus. When used in a photolithographic system for scanning a semiconductor wafer, workpiece support member 5 is preferably a wafer chuck having vacuum ports 7 for securely maintaining a wafer (not depicted) against its upper surface. As explained in further detail below with reference to FIG. 2A, workpiece cell 8 is designed to contain a suitable immersion fluid such as purified and degassed water which serves as an improved refractive medium compared with gaseous light transmission media such air, nitrogen, helium, or argon which are used in non-immersion systems.

Photolithographic apparatus 10 further preferably comprises fluid control mechanisms for controlling the condition of a fluid contained within workpiece cell 8. Specifically, and as shown in FIG. 1, workpiece support member 5 further includes fluid ingress and egress means in the form of one or more fluid pressurization ports 12 for filling, pressurizing, and circulating the contained fluid during photolithographic scanning.

Given the aim of photolithographic apparatus 10 as providing an optimal transmission medium path for irradiating a workpiece, e.g. a wafer, contained within pressure-tight workpiece cell 8 with a suitable photolithographic light source, cell cover 4 preferably comprises a transparent material selected for low light absorption characteristics. As shown by the cross-hatching in the drawing, the cell cover 4 is one-piece, unitary, and integral. In addition to providing the overhead boundary of workpiece cell 8, cell cover 4 further includes an upper surface 6 and sidewall members 3 mutually configured to define an open reservoir volume vertically bounded by the upper edges of sidewall members 3 and disposed in an overlapping manner over workpiece cell 8. As shown in the depicted embodiment, the open reservoir has a substantially planar bottom surface extending to or slightly beyond the edges of the workpiece cell 8 as defined by support members 15. The planar bottom surface of the open reservoir is preferably bounded at its peripheral edges by an indented gutter channel 16. It should be noted that while the depicted embodiment employs an open reservoir implementation, in the alternative, the reservoir supported by cell cover 4 may be enclosed or otherwise covered to prevent contaminants from entering an immersion fluid contained therein.

Figure 2A:
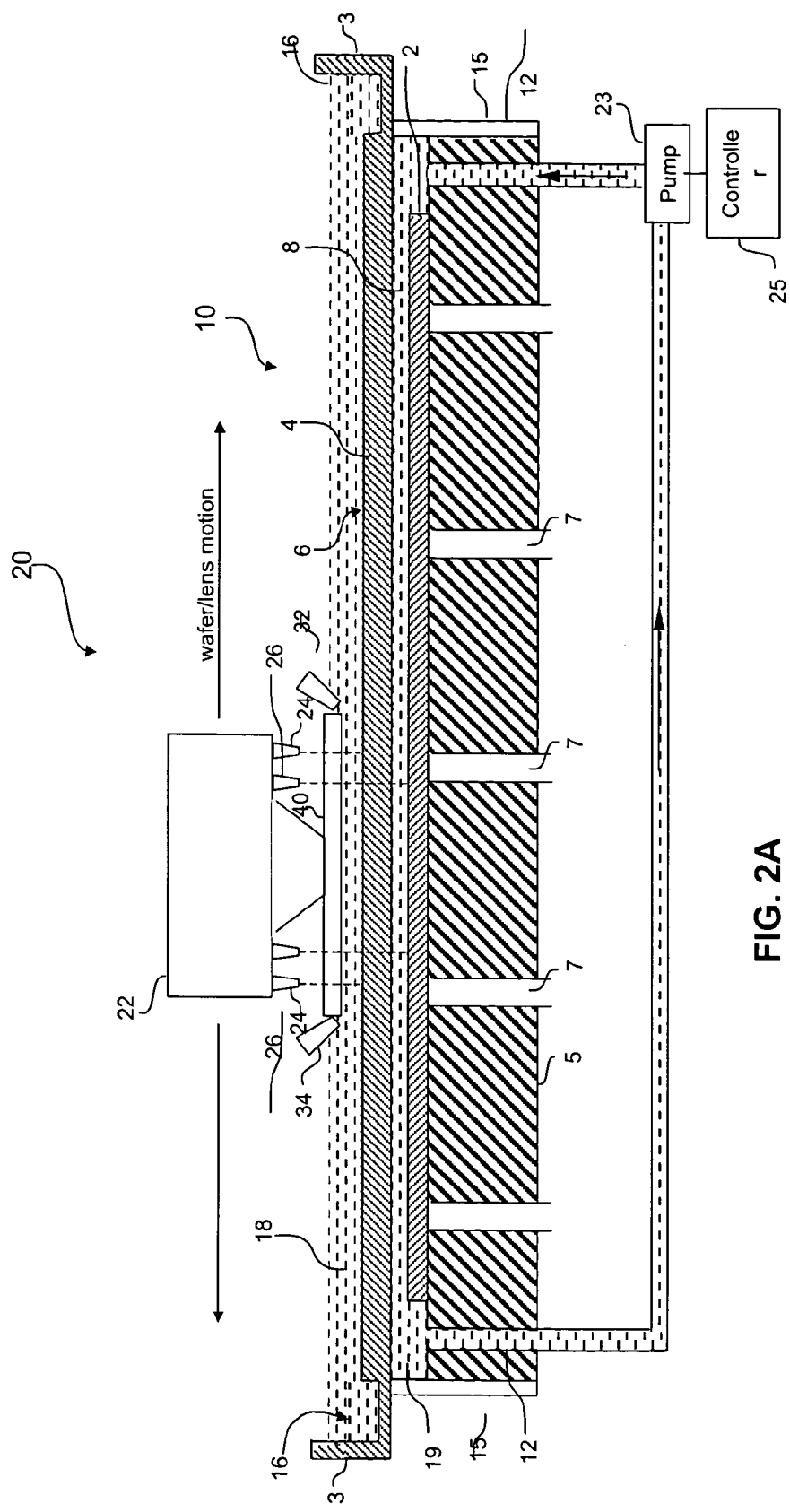
FIG. 2A illustrates a cross section of a photolithographic system in accordance with a preferred embodiment of the present invention.

Referring to FIG. 2A, there is illustrated a photolithographic system 20 incorporating the constituent components of photolithographic apparatus 10 in accordance with a preferred embodiment of the present invention. As shown in FIG. 2A, a semiconductor wafer 2 has been positioned at the bottom of workpiece cell 8 such that a fluid layer remains between the upper surface of semiconductor wafer 2 and cell cover 4. In accordance with standard photolithographic processes, the upper planar surface of wafer 2 is typically covered with a photoresist material (not depicted) that is reactive with the photolithographic light source to define an integrated circuit pattern on the wafer. Vacuum ports 7 are utilized for securely adhering wafer 2 in a specified position on the surface of support member 5, which may be a wafer chuck in the depicted embodiment. For ease of illustrating the relative disposition of several components of photolithographic system 20, cell cover 4, workpiece support member 5, and wafer 2 are depicted in cross section.

Photolithographic system 20 further includes a projection assembly 22 that preferably includes devices and components for directing and focusing a light source, such as a deep ultraviolet light beam onto the working surface of wafer 2. Although not explicitly depicted in FIG. 2A, such devices and components may include a reticle stage, a shutter stage, multiple lenses and mirrors, and other image projection control equipment familiar to those skilled in the art. While depicted in FIG. 2A as a discrete entity for ease of illustration, projection assembly 22 may actually comprise several non-mechanically connected and independently movable components and devices.

Among the devices depicted in association with projection assembly 22 are leading and trailing cover normal focus sensors 24 and leading and trailing wafer normal focus sensors 26. The cover normal sensors 24 provide a real time measurement of the vertical distance from a specified reference point to the cover member surface 6 during a stepping or step-and-scan process. Similarly, wafer normal sensors 26 provide a real time indication of the vertical gap between the projection apparatus 22 and the upper surface of wafer 2 as the lithographic apparatus 10 moves in a planar manner relative to projection apparatus 22 such as during scanning. With the goal of optimizing the lithographic focal point, the feedback from sensors 24 and 26 is used by one or more position control systems associated with either projection assembly 22 or photolithography apparatus 10 to adjust the relative vertical position of the components of the projection or photolithographic apparatus. It may be necessary to adjust the cover and wafer top surfaces independently. The relative adjustments are preferably made in accordance with the indices of refraction of the immersion liquids and cell cover.

Most conventional lithographic lenses, such as may be incorporated in a projection apparatus analogous to projection assembly 22, include a replaceable final lens element or lens cover. This lens cover element protects the lens from contaminant deposition such as might be present in the air around the lens or might emanate from the resist during exposure in a non-immersion system. In accordance with the preferred embodiment depicted in FIG. 2A, projection assembly 22 includes a final lens element 40 in the form of a lens or lens cover situated in an opposed facing manner with respect to the upper surface 6 of cell cover 4. Under photolithographic operating conditions, photolithographic apparatus 20 and projection assembly 22 are mutually positioned in the depicted vertical direction such that the final lens element 40 is at least partially immersed in an immersion fluid 18 contained in the open reservoir formed by the upper surface of cell cover 4. Serving as the final lens element, the lens or lens cover 40 preferably comprises a polished, transparent member, and more specifically may comprise synthetic quartz ($SiO_2$) for 193 nm and longer wavelengths. For 157 nm wavelengths, the synthetic quartz may be modified by removal of $OH^-$ and doping with fluorine to improve transmission.

Figure 2B:
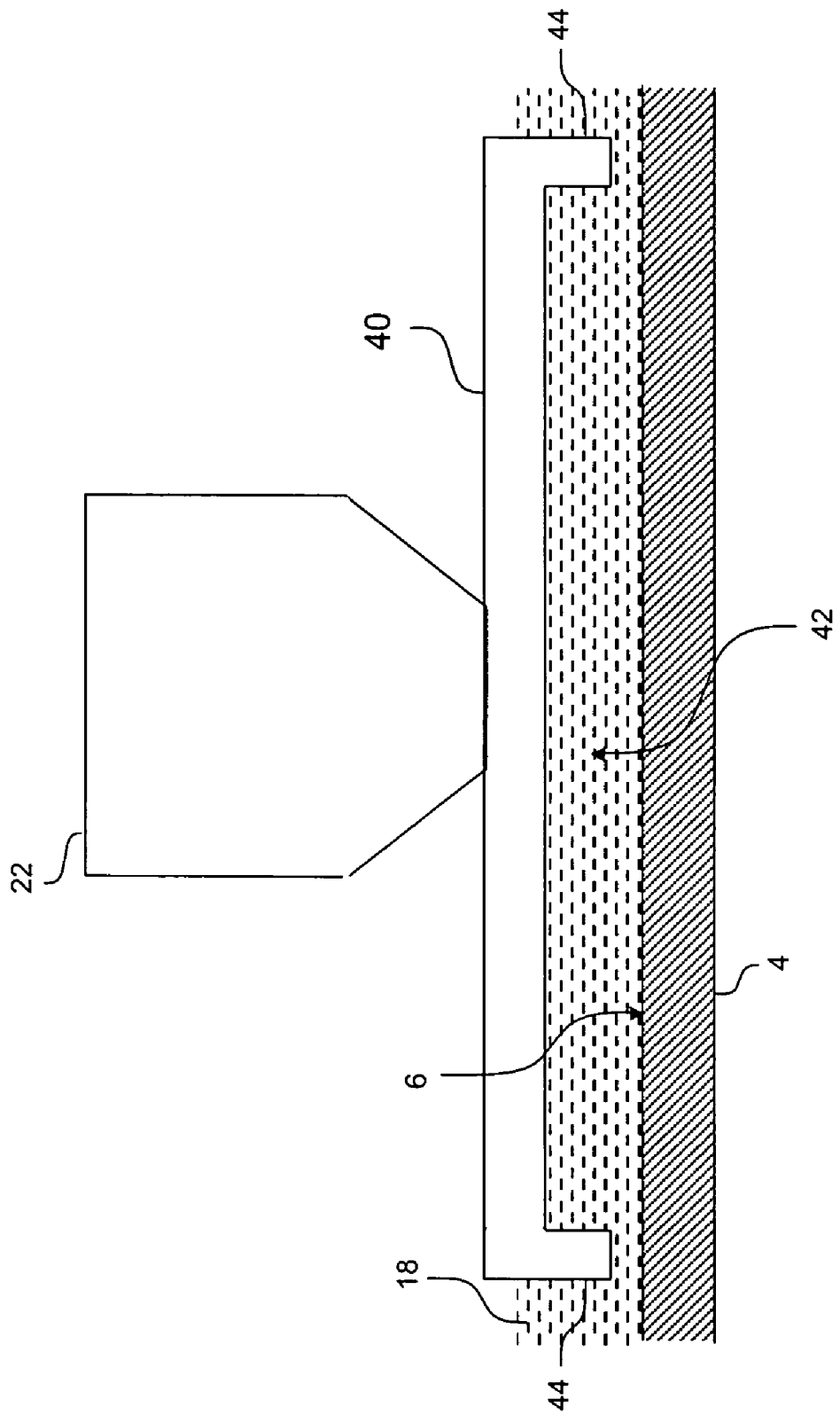
FIG. 2B depicts an alternate view of the photolithographic system shown in FIG. 2A.

As shown in the depicted embodiment, and with an alternate view depicted in FIG. 2B, final lens element 40 has dimensions and contouring characteristics for reducing some of the aforementioned problems with conventional immersion techniques relating to minimizing uneven or turbulent fluid flow at the lens cover surface. Specifically, the side view of projection apparatus shown in FIG. 2A reveals the elongated dimension and proportion of lens element 40 in parallel with the direction of relative motion between photolithographic apparatus 10 and projection assembly 22. During a scanning or step-and-scan procedure, photolithographic apparatus 10 moves as a substantially discrete unit relative to projection assembly 22 generally, and final lens element 40 in particular. The lengthwise dimension of lens element 40 is preferably at least 25 mm in order to minimize the effect of turbulence at the leading and trailing edges (with respect to the indicated direction of travel) of lens element 40 from affecting imaging near the center of the cover.

Furthermore, and as depicted in frontal cross section view (perpendicular to the side view shown in FIG. 2A) of FIG. 2B, final lens element 40 further includes lateral runners 44 forming a flow channel 42 beneath the central portion of lens element 40. The flow channel guides the liquid beneath the lens, resulting in improved and more uniform fluid flow characteristics. The lateral runners 44 protrude downwardly and extend along the outer lengthwise edges of final lens element 40 such that channel 42, containing immersion fluid 18, is formed along the bottom lengthwise surface of lens element 40. In a preferred embodiment, final lens element 40 is disposed with respect to cell cover 4 such that a fluid filled gap of between 1 to 10 mm remains between the upper surface of cell cover 4 and the bottom planar surface of lens element 40.

In accordance with the embodiments shown in FIGS. 2A and 2B, several components of the photolithographic apparatus 10, including workpiece support member 5 and support members 15 are preferably either a removable or non-removable component of a stage device, such as a servo driven wafer stage, which moves in a planar stepwise manner with respect to the lower exposure surface, including lens element 40, of projection assembly 22. With cell cover 4 in the depicted position, the enclosed immersion fluid 19 contained within workpiece cell 8 moves with the unit, thus minimizing fluid flow at the working surface boundary of wafer 2. In this manner, the present invention substantially eliminates cavitation and other bubble forming stimuli at the wafer surface. The reduction or elimination of microbubbles at the wafer/liquid boundary is particularly important since the effect of obstructing contaminants such as bubbles become more pronounced nearer the target surface.

By layering the fluid boundaries such that the open reservoir is positioned on the lens side of photolithographic system 20, any bubble or other contaminant formation will have a minimal effect on imaging. This layering method is further enhanced by the intermediate positioning of cell cover 4 that prevents bubbles or other contaminants formed in the open reservoir from reaching the enclosed workpiece cell 8. In addition, cell cover 4 acts in a manner analogous to a reticle pellicle in that bubbles or other contaminants contained in the upper immersion fluid reservoir are out of focus and cause less image degradation than would be expected if they were allowed to approach the wafer surface.

The substantial fluid isolation of workpiece cell 8 advantageously permits additional fluid control mechanisms to be employed by photolithographic system 20. Specifically, and as depicted in FIG. 2A, a fluid pump 23 and associated controller 25 may be used to fill and adjust the fluid pressure within workpiece cell 8. In one embodiment, controller 25 receives feedback from cover normal sensors 24 to increase the fluid pressure responsive to cover normal sensors 24 detecting a bow or flex in cell cover 4. In addition, controller 25 may receive any combination of pressure, flow, or temperature input signals from one or more sensors (not depicted) that sense the liquid conditions within workpiece cell 8 to maintain an optimum flow, temperature, and/or pressure using fluid control devices such as pump 23 and fluid pressure ports 12 for maintaining homogeneity of the fluid, particularly of the index of refraction of the fluid, contained within the cell.

A further advantage of the open reservoir as depicted in FIG. 2A is that it enables photolithographic system 20 to be utilized in either a "bathtub" or "shower" immersion lithography procedure. To this end, a leading nozzle 32 and trailing nozzle 34 are deployed in the depicted proximity to lens element 40 to discharge and uptake an immersion fluid layer through the channel 42 on the bottom surface of lens element 40 such as during a scanning or step-and-scan process in which apparatus 10 moves with respect to projection assembly 22.

Figure 3:
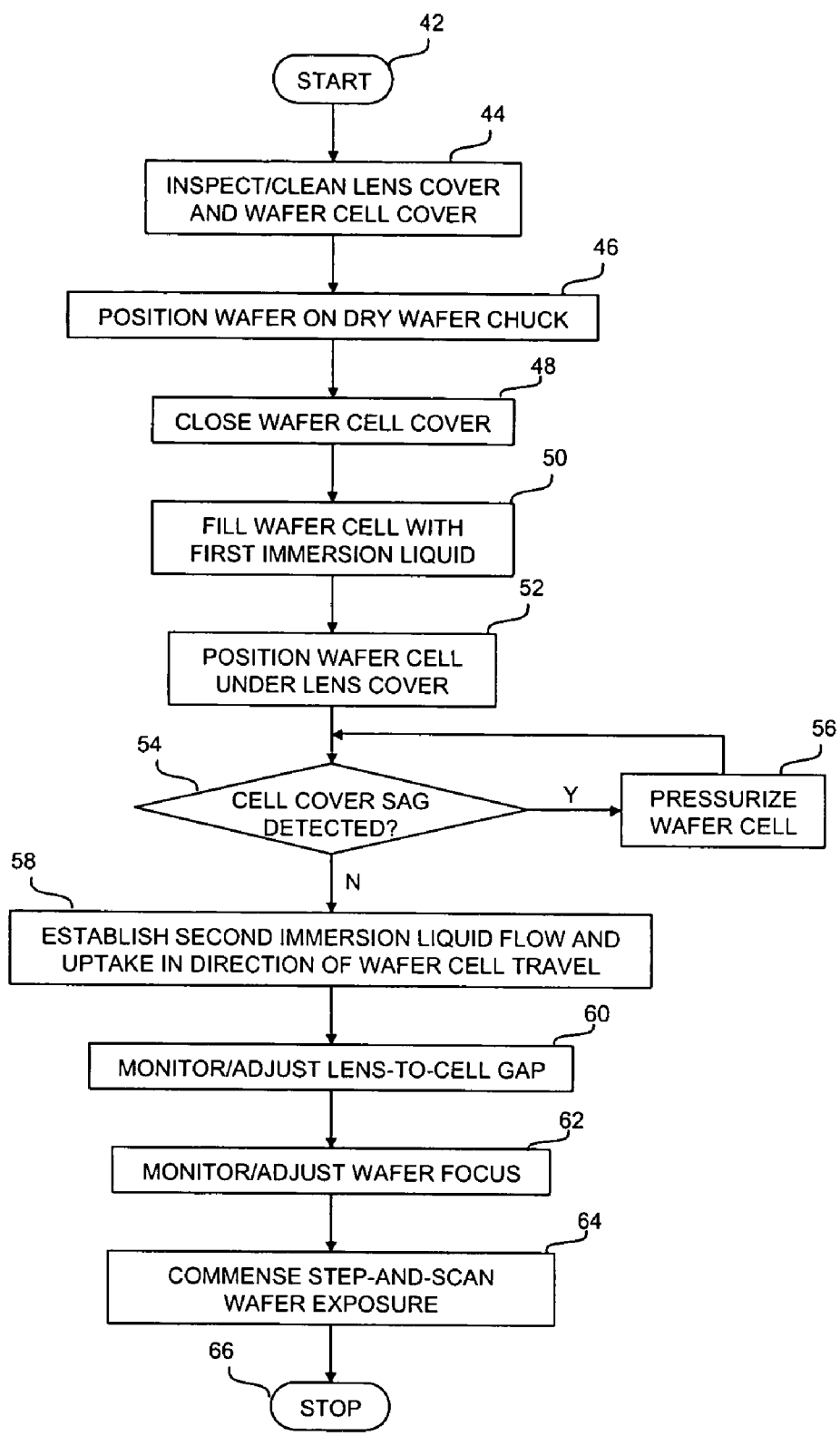
FIG. 3 is a high-level flow diagram illustrating steps performed during immersion lithography in accordance with a preferred embodiment of the present invention.

With reference to FIG. 3, there is depicted a high level flow diagram illustrating steps performed during an immersion lithography process in accordance with a preferred embodiment of the present invention. Following removal of the previous wafer from the object workpiece cell, the process begins as shown at steps 42 and 44 with the lens cover and cell cover inspected and cleaned as necessary for the next scanning iteration. After positioning the wafer on the wafer chuck that has been inspected and dried as necessary (step 46), the cell cover is closed over the wafer cell and the cell is filled with immersion fluid as depicted at steps 48 and 50.

Next, as illustrated at step 52, the cell is positioned under the lens assembly and a scanning procedure is utilized to detect cell cover sag. Responsive to detecting sag in the cell cover, the wafer cell is pressurized as depicted at steps 54 and 56. The cell is pressurized to compensate and eliminate cell cover sag and the process continues as illustrated at step 58 with a directed flow of the open reservoir fluid via nozzles 32 and 34. During a stepping or step-and-scan lithography exposure process the lens-to-cell gap and lens-to-wafer focal distance are monitored and adjusted, possibly independently, as necessary (steps 60 and 62). The process continues until all wafer fields have been covered (step 64) and the process terminates as shown at step 66.

It should be understood, however, that the invention is not necessarily limited to the specific process, arrangement, materials and components shown and described above, but may be susceptible to numerous variations within the scope of the invention.

It will be apparent to one skilled in the art that the manner of making and using the claimed invention has been adequately disclosed in the above-written description of the preferred embodiments taken together with the drawings.

It will be understood that the above description of the preferred embodiments of the present invention are susceptible to various modifications, changes and adaptations, and the same are intended to be comprehended within the meaning and range of equivalents of the appended claims.

What is claimed is:

1. An apparatus for use with a photolithographic system comprising:
   a workpiece support member; and
   a one-piece, integral, unitary cover member disposed over said workpiece support member to form a substantially enclosed and pressure-tight workpiece cell between said cover member and said workpiece support member,
   wherein said cover member is substantially transparent and includes an upper surface contoured to form an open reservoir opposite to a lower surface facing into the workpiece cell.

2. The apparatus of claim 1, further comprising a workpiece disposed within said workpiece cell and vertically supported by said workpiece support member such that a gap remains between an upper surface of said workpiece and the bottom surface of said cover member.

3. The apparatus of claim 1, wherein said cover member is substantially planar and has an index of refraction greater than one.

4. The apparatus of claim 1, wherein said workpiece cell contains a first transparent fluid having an index of refraction greater than 1.

5. The apparatus of claim 1, wherein said workpiece cell further comprises fluid ingress means for filling and pressurizing said workpiece cell with a fluid.

6. The apparatus of claim 5, wherein said fluid ingress means comprises at least one fluid inlet port.

7. The apparatus of claim 1, wherein said open reservoir contains a second transparent fluid having an index of refraction greater than 1.

8. The apparatus of claim 1, further comprising a lens apparatus disposed over the cover member such that a final lens element of said lens apparatus is positioned within said open reservoir.

9. The apparatus of claim 8, wherein said final lens element is a lens cover.

10. The apparatus of claim 9, wherein said lens apparatus moves relative to said cover member in a scanning direction, said lens cover characterized as having an elongated lengthwise dimension oriented in parallel with the scanning direction.

11. The apparatus of claim 8, further comprising a workpiece disposed within said workpiece cell, and wherein said lens apparatus further includes a workpiece normal focus sensor for determining a correct vertical position of said lens apparatus with respect to said workpiece.

12. The apparatus of claim 8, wherein said lens apparatus further includes a cover member normal focus sensor for determining a correct vertical position of said lens apparatus with respect to said cover member.

13. The apparatus of claim 1, wherein the planar bottom surface of said open reservoir is bounded at its peripheral edges by an indented gutter channel.

14. An apparatus for use with a photolithographic system comprising:
   a workpiece support member;
   a cover member disposed over said workpiece support member to form a substantially enclosed workpiece cell between said cover member and said workpiece support member, wherein said cover member is substantially transparent and includes an upper surface contoured to form an open reservoir; and a lens apparatus disposed over the cover member such that a final lens element of said lens apparatus is positioned within said open reservoir;

wherein said final lens element is a lens cover including lateral runners protruding downwardly and extending along a lengthwise dimension of said lens cover such that a lengthwise channel is formed along said bottom lengthwise surface of said lens cover.

15. The apparatus of claim 14, wherein said lens apparatus moves relative to said cover member in a scanning direction, and said lens cover lengthwise dimension is oriented in parallel with the scanning direction.

\* \* \* \* \*